United States Patent
Miki et al.

(10) Patent No.: US 10,383,222 B2
(45) Date of Patent: Aug. 13, 2019

(54) SURFACE-TREATED COPPER FOIL

(71) Applicant: JX Nippon Mining & Metals Corporation, Tokyo (JP)

(72) Inventors: Atsushi Miki, Ibaraki (JP); Ryo Fukuchi, Ibaraki (JP); Hideta Arai, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 232 days.

(21) Appl. No.: 15/398,126

(22) Filed: Jan. 4, 2017

(65) Prior Publication Data

US 2017/0196083 A1    Jul. 6, 2017

Related U.S. Application Data

(63) Continuation of application No. 15/394,983, filed on Dec. 30, 2016, now abandoned.

(30) Foreign Application Priority Data

Jan. 4, 2016 (JP) .................................. 2016-000119
Nov. 28, 2016 (JP) .................................. 2016-230684

(51) Int. Cl.
| | | |
|---|---|---|
| *H05K 1/09* | (2006.01) | |
| *C22C 9/00* | (2006.01) | |
| *C22C 30/02* | (2006.01) | |
| *C25F 1/00* | (2006.01) | |
| *C25D 3/38* | (2006.01) | |
| *C25D 3/12* | (2006.01) | |
| *C25D 11/38* | (2006.01) | |
| *C25D 7/06* | (2006.01) | |
| *C22F 1/08* | (2006.01) | |
| *H05K 3/38* | (2006.01) | |
| *C25D 5/12* | (2006.01) | |
| *C25D 3/56* | (2006.01) | |
| *C25D 3/58* | (2006.01) | |

(52) U.S. Cl.
CPC ................ *H05K 1/09* (2013.01); *C22C 9/00* (2013.01); *C22C 30/02* (2013.01); *C22F 1/08* (2013.01); *C25D 3/12* (2013.01); *C25D 3/38* (2013.01); *C25D 5/12* (2013.01); *C25D 7/0614* (2013.01); *C25D 11/38* (2013.01); *C25F 1/00* (2013.01); *H05K 3/382* (2013.01); *C25D 3/562* (2013.01); *C25D 3/565* (2013.01); *C25D 3/58* (2013.01); *H05K 3/389* (2013.01); *H05K 2201/0355* (2013.01)

(58) Field of Classification Search
None
See application file for complete search history.

(56) References Cited

U.S. PATENT DOCUMENTS

| | | |
|---|---|---|
| 2004/0161627 A1 | 8/2004 | Yoshihara et al. |
| 2012/0285734 A1 | 11/2012 | Uno et al. |
| 2013/0011690 A1 | 1/2013 | Arai et al. |

FOREIGN PATENT DOCUMENTS

| | | |
|---|---|---|
| JP | 2008118163 A | 5/2008 |
| JP | 2011168887 A | 9/2011 |
| KR | 101090197 B1 | 12/2011 |
| KR | 1020140128269 | 11/2014 |
| KR | 1020150084924 | 7/2015 |
| WO | WO-2011/138876 A1 | 11/2011 |
| WO | WO-2013/147116 A1 | 10/2013 |

OTHER PUBLICATIONS

Office Action in KR Application No. 2017-0000901 dated Jan. 12, 2019, 6 pages.

*Primary Examiner* — Daniel J. Schleis
(74) *Attorney, Agent, or Firm* — Marshall, Gerstein & Borun LLP

(57) ABSTRACT

To provide a surface-treated copper foil that is excellent in adhesiveness to an insulating substrate at ordinary temperature, and is capable of suppressing the formation of blister on application of a thermal load of reflow soldering to a copper-clad laminate board constituted by the copper foil. A surface-treated copper foil having a surface-treated surface, the surface-treated copper foil satisfying one or more of the following conditions (1) to (3): by an XPS measurement at a depth after sputtering from the surface-treated surface for 0.5 min at a rate of 1.1 nm/min ($SiO_2$ conversion), (1) the N concentration is from 1.5 to 7.5 atomic %; (2) the C concentration is from 12 to 30 atomic %; and (3) the Si concentration is 3.1 atomic % or more and the O concentration is from 40 to 48 atomic %.

38 Claims, No Drawings

SURFACE-TREATED COPPER FOIL

BACKGROUND OF THE INVENTION

Field of the Invention

The present invention relates to a surface-treated copper foil for a copper-clad laminate board.

Related Art

A printed wiring board is generally produced by the process, in which an insulating substrate is adhered to a copper or copper alloy foil (which is hereinafter referred to as a "copper foil") to form a copper-clad laminate board, and then a conductor pattern is formed on the copper foil by etching. An electronic component is then mounted on the printed wiring board by connecting with solder or the like, so as to produce a printed circuit board.

As one of the characteristic features demanded to a copper foil for a printed wiring board, good adhesiveness to an insulating substrate has been pointed out, and various techniques have been developed centering on a roughening treatment of the surface of the copper foil (see, for example, WO 2011/138876 and JP-A-2011-168887).

It has also been known that the adhesiveness to an insulating substrate of the copper foil is enhanced by treating the surface of the copper foil with a silane coupling agent (see, for example, JP-A-2011-168887 and JP-A-2008-118163). Furthermore, such a technique has been known that since the N concentration and the Si concentration on the surface of the copper foil significantly influence the adhesiveness to an insulating substrate, the N concentration and the Si concentration are controlled by such measures as a treatment of the surface of the copper foil with a silane coupling agent having a prescribed concentration (see, for example, WO 2013/147116).
Patent Literature 1: WO 2011/138876
Patent Literature 2: JP-A-2011-168887
Patent Literature 3: JP-A-2008-118163
Patent Literature 4: WO 2013/147116

The technique of controlling the N concentration and the Si concentration on the surface of the copper foil described in WO 2013/147116 is effective for enhancing the adhesiveness to an insulating substrate. In the production process of a printed circuit board described above, on the other hand, solder is often used for mounting an electronic component, and both the copper foil and the insulating substrate receive a thermal load in reflow soldering. In recent years, resistance to 300° C. or more is being demanded as the reliability in the high temperature thermal load in reflow soldering. However, it has been found that the copper-clad laminate board having been subjected to a surface treatment with a silane coupling agent as described in WO 2013/147116 tends to generate blister on the copper-clad laminate board due to the thermal load of reflow soldering at 300° C. or more although good adhesiveness can be obtained. In the copper-clad laminate board that tends to generate blister due to a thermal load, the circuit tends to cause deformation and detachment on mounting an electronic component. Accordingly, it may be advantageous to provide a copper-clad laminate board that is suppressed in formation of blister on receiving a thermal load, in addition to the good adhesiveness at ordinary temperature.

SUMMARY OF THE INVENTION

The invention has been developed under the above-mentioned circumstances, and an object thereof is to provide a surface-treated copper foil that is excellent in adhesiveness to an insulating substrate at ordinary temperature, and is capable of suppressing the formation of blister on application of a thermal load of reflow soldering to a copper-clad laminate board constituted by the copper foil. Another object of the invention is to provide a copper-clad laminate board that has the surface-treated copper foil.

As a result of earnest investigations made by the present inventors for solving the problems, it has been found that while the concentrations of N and Si in an XPS survey measurement of the surface of the surface-treated copper foil are controlled in WO 2013/147116, it is important to control the N concentration, the C concentration, or the combination of the Si and O concentrations in the depth profile of the surface of the surface-treated copper foil, for suppressing blister on heating.

The invention relates to, in one aspect, a surface-treated copper foil having a surface-treated surface, the surface-treated copper foil having an N concentration of from 1.5 to 7.5 atomic % by an XPS measurement at a depth after sputtering from the surface-treated surface for 0.5 min at a rate of 1.1 nm/min ($SiO_2$ conversion).

The invention relates to, in another aspect, a surface-treated copper foil having a surface-treated surface, the surface-treated copper foil having a C concentration of from 12 to 30 atomic % by an XPS measurement at a depth after sputtering from the surface-treated surface for 0.5 min at a rate of 1.1 nm/min ($SiO_2$ conversion).

The invention relates to, in still another aspect, a surface-treated copper foil having a surface-treated surface, the surface-treated copper foil having an Si concentration of 3.1 atomic % or more and an O concentration of from 40 to 48 atomic % by an XPS measurement at a depth after sputtering from the surface-treated surface for 0.5 min at a rate of 1.1 nm/min ($SiO_2$ conversion).

The invention relates to, in still another aspect, a surface-treated copper foil having a surface-treated surface, the surface-treated copper foil satisfying two or more of the following conditions (1) to (3):

(1) the surface-treated copper foil having an N concentration of from 1.5 to 7.5 atomic % by an XPS measurement at a depth after sputtering from the surface-treated surface for 0.5 min at a rate of 1.1 nm/min ($SiO_2$ conversion);

(2) the surface-treated copper foil having a C concentration of from 12 to 30 atomic % by an XPS measurement at a depth after sputtering from the surface-treated surface for 0.5 min at a rate of 1.1 nm/min ($SiO_2$ conversion); and (3) the surface-treated copper foil having an Si concentration of 3.1 atomic % or more and an O concentration of from 40 to 48 atomic % by an XPS measurement at a depth after sputtering from the surface-treated surface for 0.5 min at a rate of 1.1 nm/min ($SiO_2$ conversion).

In one embodiment of the surface-treated copper foil according to the invention, the surface-treated copper foil has an N concentration of from 0.5 to 6.0 atomic % by an XPS measurement at a depth after sputtering from the surface-treated surface for 1.0 min at a rate of 1.1 nm/min ($SiO_2$ conversion).

In another embodiment of the surface-treated copper foil according to the invention, the surface-treated copper foil has a C concentration of from 8 to 25 atomic % by an XPS measurement at a depth after sputtering from the surface-treated surface for 1.0 min at a rate of 1.1 nm/min ($SiO_2$ conversion).

In still another embodiment of the surface-treated copper foil according to the invention, the surface-treated copper foil satisfies one or two of the following conditions (A) and (B):

(A) the surface-treated copper foil having an N concentration of from 3.7 to 6.4 atomic % by an XPS measurement at a depth after sputtering from the surface-treated surface for 0.5 min at a rate of 1.1 nm/min ($SiO_2$ conversion);

(B) the surface-treated copper foil having a C concentration of from 21.6 to 23.8 atomic % by an XPS measurement at a depth after sputtering from the surface-treated surface for 0.5 min at a rate of 1.1 nm/min ($SiO_2$ conversion).

In still another embodiment of the surface-treated copper foil according to the invention, the surface-treated surface has a ten-point average surface roughness Rz of 1.5 µm or less.

In still another embodiment of the surface-treated copper foil according to the invention, the surface-treated copper foil is a rolled copper foil or an electrolytic copper foil.

In still another embodiment of the surface-treated copper foil according to the invention, the surface-treated copper foil is for attaching to a liquid crystal polymer.

In still another embodiment of the surface-treated copper foil according to the invention, the surface-treated copper foil is for attaching to a polyimide resin.

In still another embodiment of the surface-treated copper foil according to the invention, the surface-treated copper foil is used in a printed circuit board that is used under a high frequency exceeding 1 GHz.

In still another embodiment of the surface-treated copper foil according to the invention, the surface-treated copper foil contains, on a surface of the copper foil, one or more layers selected from the group consisting of a roughening treatment layer, a heat resistance treatment layer, a rust prevention treatment layer, a chromate treatment layer, and a silane coupling treatment layer.

In still another embodiment of the surface-treated copper foil according to the invention, the surface-treated copper foil contains, on a surface of the copper foil, one or more layers selected from the group consisting of a heat resistance treatment layer, a rust prevention treatment layer, a chromate treatment layer, and a silane coupling treatment layer.

In still another embodiment of the surface-treated copper foil according to the invention, the surface-treated copper foil contains a heat resistance treatment layer or a rust prevention treatment layer on a surface of the copper foil, contains a chromate treatment layer on the heat resistance treatment layer or the rust prevention treatment layer, and contains a silane coupling treatment layer on the chromate treatment layer.

In still another embodiment of the surface-treated copper foil according to the invention, the surface-treated copper foil contains a heat resistance treatment layer on a surface of the copper foil, contains a rust prevention treatment layer on the heat resistance treatment layer, contains a chromate treatment layer on the rust prevention treatment layer, and contains a silane coupling treatment layer on the chromate treatment layer.

In still another embodiment of the surface-treated copper foil according to the invention, the surface-treated copper foil contains a chromate treatment layer on a surface of the copper foil, and contains a silane coupling treatment layer on the chromate treatment layer.

In still another embodiment of the surface-treated copper foil according to the invention, the surface-treated copper foil contains a roughening treatment layer on a surface of the copper foil, contains a chromate treatment layer on the roughening treatment layer, and contains a silane coupling treatment layer on the chromate treatment layer.

In still another embodiment of the surface-treated copper foil according to the invention, the surface-treated copper foil contains a roughening treatment layer on a surface of the copper foil, contains one or more layers selected from the group consisting of a rust prevention treatment layer and a heat resistance treatment layer on the roughening treatment layer, contains a chromate treatment layer on the one or more layers selected from the group consisting of a rust prevention treatment layer and a heat resistance treatment layer, and contains a silane coupling treatment layer on the chromate treatment layer.

In still another embodiment of the surface-treated copper foil according to the invention, the surface-treated copper foil contains a roughening treatment layer on a surface of the copper foil, contains a rust prevention treatment layer on the roughening treatment layer, contains a chromate treatment layer on the rust prevention treatment layer, and contains a silane coupling treatment layer on the chromate treatment layer.

In still another embodiment of the surface-treated copper foil according to the invention, the surface-treated copper foil contains a roughening treatment layer on a surface of the copper foil, and contains a silane coupling treatment layer on the roughening treatment layer.

In still another embodiment of the surface-treated copper foil according to the invention, the surface-treated copper foil contains a silane coupling treatment layer on a surface of the copper foil.

In still another embodiment of the surface-treated copper foil according to the invention, the surface-treated copper foil contains a roughening treatment layer on a surface of the copper foil, and the roughening treatment layer contains a primary particle layer and a secondary particle layer on the primary particle layer.

In still another embodiment of the surface-treated copper foil according to the invention, the secondary particle layer contains a ternary alloy system containing copper, cobalt, and nickel.

In still another embodiment of the surface-treated copper foil according to the invention, the primary particle layer has an average particle diameter of from 0.25 to 0.45 µm, and the secondary particle layer has an average particle diameter of from 0.05 to 0.25 µm.

The invention relates to, in still another aspect, a copper foil-laminated board containing the surface-treated copper foil according to the invention and an insulating substrate that is adhered to the surface-treated surface of the surface-treated copper foil.

The invention relates to, in still another aspect, a printed wiring board containing the surface-treated copper foil according to the invention.

The invention relates to, in still another aspect, an electronic apparatus containing the printed wiring board according to the invention.

According to the invention, there is provided a surface-treated copper foil that is excellent in adhesiveness to an insulating substrate at ordinary temperature, and is capable of suppressing the formation of blister on application of a thermal load to a copper-clad laminate board constituted by the copper foil. Accordingly, deformation and detachment of the circuit due to the heat generated on mounting an electronic component on the printed wiring board by soldering are suppressed, and thereby the surface-treated copper foil contributes to production of a printed circuit board having high quality and reliability.

DESCRIPTION OF THE EMBODIMENTS

In one embodiment of the invention, at least one selected from the N atomic concentration, the C atomic concentration, and the combination of the Si and O atomic concentrations by an XPS measurement at a depth after sputtering from the surface-treated surface of the surface-treated copper foil for 0.5 min at a rate of 1.1 nm/min ($SiO_2$ conversion) (which may be hereinafter referred to as a "0.5 min sputter depth") is controlled. According to the result of the investigations made by the inventors, the control of at least one selected from the N atomic concentration, the C atomic concentration, and the combination of the Si and O atomic concentrations at a 0.5 min sputter depth is effective for enhancing the adhesiveness to an insulating substrate at ordinary temperature, and suppressing the formation of blister on application of a thermal load to a copper-clad laminate board constituted by the copper foil.

The N concentration by an XPS measurement at a 0.5 min sputter depth is preferably 1.5 atomic % or more, more preferably 3.7 atomic % or more, and further preferably 4.0 atomic % or more, from the standpoint of the enhancement of the adhesion strength to an insulating substrate. The N concentration by an XPS measurement at that depth is preferably 7.5 atomic % or less, more preferably 6.7 atomic % or less, and further preferably 6.6 atomic % or less, and further preferably 6.4 atomic % or less from the standpoint of the suppression of the formation of blister.

The C concentration by an XPS measurement at a 0.5 min sputter depth is preferably 12 atomic % or more, more preferably 18 atomic % or more, and further preferably 21.6 atomic % or more, from the standpoint of the enhancement of the adhesion strength to an insulating substrate. The C concentration by an XPS measurement at that depth is preferably 30 atomic % or less, more preferably 28.6 atomic % or less, and further preferably 23.8 atomic % or less, from the standpoint of the suppression of the formation of blister.

The combination of the Si and O concentrations by an XPS measurement at a 0.5 min sputter depth is preferably 3.1 atomic % or more for Si and 40 atomic % or more for O, more preferably 4.3 atomic % or more for Si and 43.4 atomic % or more for O, and further preferably 5.8 atomic % or more for Si and 44.6 atomic % or more for O, from the standpoint of the enhancement of the adhesion strength to an insulating substrate. The combination of the Si and O concentrations by an XPS measurement at that depth is preferably 12.6 atomic % or less for Si and 48 atomic % or less for O, more preferably 12.4 atomic % or less for Si and 47 atomic % or less for O, and further preferably 11.9 atomic % or less for Si and 46.4 atomic % or less for O, from the standpoint of the suppression of the formation of blister.

In the case where at least one of the N atomic concentration, the C atomic concentration, and the combination of the Si and O atomic concentrations by an XPS measurement at a 0.5 min sputter depth satisfies the aforementioned concentration condition, the adhesion strength to an insulating substrate can be enhanced, and the formation of blister can be significantly suppressed. In the three atomic concentration requirements, i.e., the N concentration, the C concentration, and the combination of the Si and O concentrations, it is preferred that two or more thereof satisfy the aforementioned concentration condition, and it is more preferred that all the three thereof satisfy the aforementioned concentration condition.

In one preferred embodiment of the invention, at least one selected from the N and C atomic concentrations by an XPS measurement at a depth after sputtering from the surface-treated surface of the surface-treated copper foil for 1.0 min at a rate of 1.1 nm/min ($SiO_2$ conversion) (which may be hereinafter referred to as a "1.0 min sputter depth") is controlled. According to the result of the investigations made by the inventors, the control of at least one or both of the N and C atomic concentrations at a 1.0 min sputter depth, in addition to the atomic concentrations at a 0.5 min sputter depth, is further effective for enhancing the adhesiveness to an insulating substrate at ordinary temperature, and suppressing the formation of blister on application of a thermal load to a copper-clad laminate board constituted by the copper foil.

The N concentration by an XPS measurement at a 1.0 min sputter depth is preferably 0.5 atomic % or more, more preferably 1.0 atomic % or more, and further preferably 1.8 atomic % or more, from the standpoint of the enhancement of the adhesion strength to an insulating substrate. The N concentration by an XPS measurement at that depth is preferably 6.0 atomic % or less, more preferably 4.7 atomic % or less, and further preferably 4.2 atomic % or less, from the standpoint of the suppression of the formation of blister.

The C concentration by an XPS measurement at a 1.0 min sputter depth is preferably 8 atomic % or more, more preferably 16.8 atomic % or more, and further preferably 18.4 atomic % or more, from the standpoint of the enhancement of the adhesion strength to an insulating substrate. The C concentration by an XPS measurement at that depth is preferably 25 atomic % or less, more preferably 21.3 atomic % or less, and further preferably 20.7 atomic % or less, from the standpoint of the suppression of the formation of blister.

The atomic concentrations of the elements by an XPS measurement at those depths can be measured by performing XPS analysis in the depth profile for the surface-treated surface of the surface-treated copper foil.

In the examples of the aspect of the invention, the analysis was performed under the following condition.

Equipment: 5600MC, available from Ulvac-Phi, Inc.
Ultimate vacuum degree: $5.7 \times 10^{-7}$ Pa
Excitation source: monochromated MgKa
Output Power: 400 W
Detected area: 800 µm in diameter
Incident angle: 81°
Takeoff angle: 45°
Neutralizer: not used <Sputtering Condition>
Ion species: $Ar^+$
Acceleration voltage: 1 kV
Sweep area: 3 mm×3 mm
Rate: 1.1 nm/min ($SiO_2$ conversion)

In the aspect of the invention, the atomic concentrations of N, C, Si, and O in the XPS measurement are given as the molar fractions of N1s, C1s, Si2s, and O1s, respectively, with respect to the total molar number of N1s, O1s, C1s, Si2s, $Cr2p^3$, $Zn2p^3$, $Cu2p^3$, $Ni2p^3$, and $Co2p^3$ as 100%.

One example of the measures for forming the surface-treated surface having the N concentration, the C concentration, and the combination of the Si and O concentrations controlled to the aforementioned ranges is a method of treating the surface of the copper foil with a silane coupling agent. In the treatment of the surface of the copper foil with the silane coupling agent, it is important to select appropriately the kind of the silane coupling agent, the concentration of the silane coupling agent in water and the stirring time.

As the silane coupling agent, though not particularly limited, an aminosilane containing N and Si in the molecule thereof may be preferably used. The aminosilane used may be a silane containing one or more of an amino group or an imino group. The number of the amino group or the imino group contained in the aminosilane may be, for example, from 1 to 4, preferably from 1 to 3, and more preferably 1 or 2. In a preferred embodiment, the numbers of the amino group and/or the imino group contained in the aminosilane each may be 1.

The aminosilane having a total number of the amino group and the imino group contained in the aminosilane of 1 may be referred to as a monoaminosilane, the aminosilane having a total number of the amino group and the imino group of 2 may be referred to as a diaminosilane, and aminosilane having a total number of the amino group and the imino group of 3 may be referred to as a triaminosilane. A monoaminosilane and a diaminosilane may be preferably used in the aspect of the invention. In a preferred embodiment, a monoaminosilane that contains one amino group can be used as the aminosilane. In a preferred embodiment, the aminosilane may contain at least one (one for instance) amino group at an end of the molecule thereof, and preferably at an end of the linear or branched chain molecule.

Examples of the amino silane include
N-2-(aminoethyl)-3-aminopropylmethyldimethoxysilane,
N-2-(aminoethyl)-3-aminopropyltrimethoxysilane,
3-aminopropyltrimethoxysilane,
1-aminopropyltrimethoxysilane,
2-aminopropyltrimethoxysilane,
1,2-diaminopropyltrimethoxysilane,
3-amino-1-propenyltrimethoxysilane,
3-amino-1-propynyltrimethoxysilane,
3-triethoxysilyl-N-(1,3-dimethylbutylidene)propylamine,
N-phenyl-3-aminopropyltrimethoxysilane,
N-(vinylbenzyl)-2-aminoethyl-3-aminopropyltrimethoxysilane,
3-aminopropyltriethoxysilane,
3-aminopropyltrimethoxysilane,
N-(2-aminoethyl)-3-aminopropyltrimethoxysilane,
N-(2-aminoethyl)-3-aminopropylmethyldimethoxysilane, and
3-(N-phenyl)aminopropyltrimethoxysilane.

In a preferred embodiment, a silane coupling agent having a structure represented by the following formula (I) can be used.

$$H_2N-R^1-Si(OR^2)_2(R^3) \quad (I)$$

wherein in the formula (I), $R^1$ represents a linear or branched, saturated or unsaturated, substituted or unsubstituted, cyclic or acyclic divalent group of a $C_1$ to $C_{12}$ hydrocarbon containing a heterocyclic ring or not containing a heterocyclic ring;

$R^2$ represents a $C_1$ to $C_5$ alkyl group; and $R^3$ represents a $C_1$ to $C_5$ alkyl group or a $C_1$ to $C_5$ alkoxy group.

$R^1$ preferably represents a group selected from the group consisting of a divalent group of a substituted or unsubstituted $C_1$ to $C_{12}$ linear saturated hydrocarbon, a divalent group of a substituted or unsubstituted $C_1$ to $C_{12}$ branched saturated hydrocarbon, a divalent group of a substituted or unsubstituted $C_1$ to $C_{12}$ linear unsaturated hydrocarbon, a divalent group of a substituted or unsubstituted $C_1$ to $C_{12}$ branched unsaturated hydrocarbon, a divalent group of a substituted or unsubstituted $C_1$ to $C_{12}$ cyclic hydrocarbon, a divalent group of a substituted or unsubstituted $C_1$ to $C_{12}$ heterocyclic hydrocarbon, and a divalent group of a substituted or unsubstituted $C_1$ to $C_{12}$ aromatic hydrocarbon.

$R^1$ preferably represents a group selected from the group consisting of $-(CH_2)_n-$, $-(CH_2)_n-(CH)_m-(CH_2)_{j-1}-$, $-(CH_2)_n-(CC)-(CH_2)_{n-1}-$,  $-(CH_2)_n-NH-(CH_2)_m-$, $-(CH_2)_n-NH-(CH_2)_m-NH-(CH_2)_j-$, $-(CH_2)_{n-1}-(CH)NH_2-(CH_2)_{m-1}-$, and $-(CH_2)_{n-1}-(CH)NH_2-(CH_2)_{m-1}-NH-(CH_2)_j-$ (wherein n, m, and j each represents an integer of 1 or more).

$R^1$ more preferably represents $-(CH_2)_n-$ or $-(CH_2)_n-NH-(CH_2)_m-$.

n, m, and j each independently represents 1, 2, or 3.

$R^2$ preferably represents a methyl group or an ethyl group.

$R^3$ preferably represents a methyl group, an ethyl group, a methoxy group, or an ethoxy group.

It is important to perform the silane coupling treatment at a higher concentration of the silane coupling agent in water than the ordinary technique (for example, 1.0% by volume or more), for achieving high adhesiveness to an insulating substrate, but it should be noted that when the concentration thereof is too high, the concentration of N, C, or O may become excessive, and therefore, it may be difficult to suppress the blister. For example, the concentration of the silane coupling agent in water may be from 1.5 to 6% by volume, and preferably from 2.0 to 4.0% by volume.

The silane coupling agent may be provided in the form of an aqueous solution by mixing the silane and water, and it is important to set appropriately the stirring time for mixing them depending on the kind and the concentration of the silane coupling agent. The optimum stirring time may vary depending on the kind and the concentration of the silane coupling agent and cannot be discussed generally, and may be selected as a rough standard from a range of from 1 to 24 hours. In the case where the stirring time is short, for example, less than 0.5 hour, $OR^2$ or $R^3$ in $Si(OR^2)_2(R^3)$ in the formula (I) may not be sufficiently substituted by an OH group (a hydroxyl group) since the hydrolysis of the silane coupling agent may not proceed sufficiently, thereby failing to provide the intended adhesiveness. In this case, there are a large amount of a $C_1$ to $C_5$ alkyl group corresponding to $R^2$ and $R^3$ remaining in the silane coupling layer. When the silane coupling agent is used in an amount that is larger than the optimum amount for further enhancing the adhesiveness, not only the C concentration, but also the N concentration and the O concentration are increased. The stirring time is preferably 2 hours or more, more preferably 5 hours or more, and further preferably 12 hours or more. In the stirring for a prolonged period of time, the influence of the fluctuation of the pH and the temperature may be increased, and an amino group containing N and a hydroxyl group containing O may form a hydrogen bond within the silane coupling agent, thereby failing to form the intended crosslinked structure between the metal and the resin. Furthermore, there is a possibility of denaturation of the silane coupling agent since an amino group and a hydroxyl group tend to receive the influence of pH. In these cases, a difficulty may occur in the industrial use.

The concentration condition of the surface-treated surface in the aspect of the invention described above tends to be satisfied with a short stirring time in the case where the total number of the amino group and the imino group in the silane coupling agent is large, or with a long stirring time in the case where the total number of the amino group and the imino group therein is small. The concentration condition of the surface-treated surface in the aspect of the invention described above tends to be satisfied with a short stirring time in the case where the concentration of the silane coupling agent in water is high, or with a long stirring time in the case where the concentration thereof is low.

The method for the surface treatment of the copper foil with the silane coupling agent may be any of spraying, coating with a coater, immersing, pouring, and the like of an aqueous solution of the silane coupling agent. After the silane coupling treatment, it is necessary to make the drying temperature not too high and the drying time not too long. This is because the silane coupling agent present on the surface of the copper foil may be decomposed in some cases when the drying temperature is too high or the drying time is too long. For example, the drying temperature may be from 70 to 150° C., and the drying time may be from 1 second to 10 minutes.

Though the kind of the copper foil (original foil) to be subjected to the surface treatment is not particularly limited, a rolled copper foil and an electrolytic copper foil can be favorably used. The copper foil herein includes a pure copper foil and a copper alloy foil, and may have a known arbitrary composition for forming a circuit. The copper foil to be subjected to the surface treatment may be an ultrathin copper layer of a carrier-attached copper foil containing a carrier, a release layer, and an ultrathin copper layer in this order, and the copper foil to be subjected to the surface treatment may have a carrier. The carrier-attached copper foil and the carrier may be any kind of carrier-attached copper foil and carrier, respectively, and a known carrier-attached copper foil and a known carrier may be used.

In the aspect of the invention, the adhesiveness to an insulating substrate is enhanced by controlling one or more of the N atomic concentration, the C atomic concentration, and the combination of the Si and O atomic concentrations, and therefore there is not a large necessity of increasing the surface roughness for enhancing the adhesiveness to an insulating substrate. Accordingly, the surface roughness on the surface-treated surface of the surface-treated copper foil can be decreased to reduce the conductor loss while ensuring the adhesiveness to an insulating substrate. The reduced conductor loss is advantageous in the application to a printed circuit board that is used, for example, under a high frequency exceeding 1 GHz. For the surface roughness on the surface-treated surface, specifically, the ten-point average surface roughness Rz measured according to JIS B0601-1982 with a stylus roughness meter is preferably 1.5 μm or less, more preferably 1.2 μm or less, and further preferably 1.0 μm or less, and may be, for example, from 0.2 to 1.5 μm.

Another example of the measures for forming the surface-treated surface having the N concentration, the C concentration, and the combination of the Si and O concentrations controlled to the aforementioned ranges is a method of attaching N, C, Si, and O to the surface of the copper foil by drying plating, such as sputtering, CVD, and PVD, and then heating at a temperature for a period of time that are appropriately set. The concentrations of N, C, Si, and O on the surface-treated surface can be controlled by adjusting the heating condition.

In one embodiment, the surface-treated copper foil according to the aspect of the invention may contain, on a surface of the copper foil, one or more layers selected from the group consisting of a roughening treatment layer, a heat resistance treatment layer, a rust prevention treatment layer, a chromate treatment layer, and a silane coupling treatment layer. In one embodiment, the surface-treated copper foil according to the aspect of the invention may contain, on a surface of the copper foil, one or more layers selected from the group consisting of a heat resistance treatment layer, a rust prevention treatment layer, a chromate treatment layer, and a silane coupling treatment layer.

The roughening treatment layer is not particularly limited, and any of roughening treatment layers and the known roughening treatment layers may be applied thereto. The heat resistance treatment layer is not particularly limited, and any of heat resistance treatment layers and the known heat resistance treatment layers may be applied thereto. The rust prevention treatment layer is not particularly limited, and any of rust prevention treatment layers and the known rust prevention treatment layers may be applied thereto. The plating treatment layer is not particularly limited, and any of plating treatment layers and the known plating treatment layers may be applied thereto. The chromate treatment layer is not particularly limited, and any of chromate treatment layers and the known chromate treatment layers may be applied thereto.

In one embodiment, the surface-treated copper foil according to the aspect of the invention may contain, on a surface of the copper foil, a roughening treatment layer by subjecting the surface to a roughening treatment, for example, for enhancing the adhesiveness to an insulating substrate, and the like. The roughening treatment may be performed, for example, by forming roughening particles with copper or a copper alloy. The roughening treatment layer may be a layer formed of an elementary substance selected from the group consisting of copper, nickel, phosphorus, tungsten, arsenic, molybdenum, chromium, cobalt, and zinc, or an alloy containing one or more selected from the group, or the like. Roughening particles may be formed with copper or a copper alloy, and then a roughening treatment may further be performed by providing secondary particles or tertiary particles with an elementary substance or an alloy of nickel, cobalt, copper, or zinc, or the like. In particular, such a roughening treatment layer is preferred that contains a primary particle layer of copper, and a secondary particle layer formed of a ternary alloy of copper, cobalt, and nickel, formed on the primary particle layer. It is preferred that the primary particle layer has an average particle diameter of from 0.25 to 0.45 μm, and the secondary particle layer has an average particle diameter of from 0.05 to 0.25 μm.

In one embodiment of the surface-treated copper foil according to the aspect of the invention, after performing the roughening treatment, a heat resistance treatment layer or a rust prevention treatment layer may be formed with an elementary substance or an alloy of nickel, cobalt, copper, or zinc, or the like, and a chromate treatment, a silane coupling treatment, and the like may be further performed on the surface of the heat resistance treatment layer or the rust prevention treatment layer. In alternative, without performing the roughening treatment, a heat resistance treatment layer or a rust prevention treatment layer may be formed with an elementary substance or an alloy of nickel, cobalt, copper, or zinc, or the like, and a chromate treatment, a silane coupling treatment, and the like may be further performed on the surface of the heat resistance treatment layer or the rust prevention treatment layer.

Specifically, one or more layers selected from the group consisting of a heat resistance treatment layer, a rust prevention treatment layer, a chromate treatment layer, and a silane coupling treatment layer may be formed on the surface of the roughening treatment layer, and one or more layers selected from the group consisting of a heat resistance treatment layer, a rust prevention treatment layer, a chromate treatment layer, and a silane coupling treatment layer may be formed on the surface of the copper foil. The heat resistance treatment layer, the rust prevention treatment layer, the chromate treatment layer, and the silane coupling treatment layer each may be formed of plural layers (for example, two or more layers, or three or more layers). In the aspect of the invention, the "rust prevention treatment layer" includes the "chromate treatment layer". In consideration of the adhesiveness to a resin, a silane coupling layer is preferably provided as the outermost layer of the surface-treated copper foil.

Examples of the rust prevention treatment or the chromate treatment used include the following treatments.
<Ni Plating>
  Composition of solution: Ni ion: 10 to 40 g/L
  pH: 1.0 to 5.0
  Temperature of solution: 30 to 70° C.
  Current density: 1 to 9 A/dm$^2$
  Energizing time: 0.1 to 3 sec
<Ni—Co Plating>: Ni—Co Alloy Plating
  Composition of solution: Co: 1 to 20 g/L, Ni: 1 to 20 g/L
  pH: 1.5 to 3.5
  Temperature of solution: 30 to 80° C.
  Current density: 1 to 20 A/dm$^2$
  Energizing time: 0.5 to 4 sec
<Zn—Ni Plating>: Zn—Ni Alloy Plating
  Composition of solution: Zn: 10 to 30 g/L, Ni: 1 to 10 g/L
  pH: 3 to 4
  Temperature of solution: 40 to 50° C.
  Current density: 0.5 to 5 A/dm$^2$
  Energizing time: 1 to 3 sec
<Ni—Mo Plating>: Ni—Mo Alloy Plating
  Composition of solution: nickel sulfate: 270 to 280 g/L, nickel chloride: 35 to 45 g/L, nickel acetate: 10 to 20 g/L, molybdenum (added as sodium molybdate): 0.1 to 10 g/L, trisodium citrate: 15 to 25 g/L, gloss agent: saccharin, butynediol, or the like, sodium dodecyl sulfate: 55 to 75 ppm
  pH: 4 to 6
  Temperature of solution: 55 to 65° C.
  Current density: 1 to 11 A/dm$^2$
  Energizing time: 1 to 20 sec
<Cu—Zn Plating>: Cu—Zn Alloy Plating
  Composition of solution: NaCN: 10 to 30 g/L, NaOH: 40 to 100 g/L, Cu: 60 to 120 g/L, Zn: 1 to 10 g/L
  Temperature of solution: 60 to 80° C.
  Current density: 1 to 10 A/dm$^2$
  Energizing time: 1 to 10 sec
<Electrolytic Chromate>
  Composition of solution: chromic anhydride, chromic acid, or potassium bichromate: 1 to 10 g/L, zinc (added as zinc sulfate when added): 0 to 5 g/L
  pH: 0.5 to 10
  Temperature of solution: 40 to 60° C.
  Current density: 0.1 to 2.6 A/dm$^2$
  Coulomb amount: 0.5 to 90 As/dm$^2$
  Energizing time: 1 to 30 sec
<Immersion Chromate>
  Composition of solution: chromic anhydride, chromic acid, or potassium bichromate: 1 to 10 g/L, zinc (added as zinc sulfate when added): 0 to 5 g/L
  pH: 2 to 10
  Temperature of solution: 20 to 60° C.
  Treatment time: 1 to 30 sec A copper foil-laminated board can be formed by adhering the surface-treated surface of the surface-treated copper foil according to the aspect of the invention to an insulating substrate. The copper foil-laminated board may be a single layer copper-clad laminate board containing an insulating substrate having a single layer structure, or a multilayer copper-clad laminate board containing two or more layers of insulating substrates. The copper foil-laminated board may be a flexible board or a rigid board. Examples of the insulating substrate include, but not particularly limited to, an epoxy resin, a phenol resin, a polyimide resin, a polyamideimide resin, a polyester resin, a polyphenylene sulfide resin, a polyether imide resin, a fluorine resin, a liquid crystal polymer (LPC), and mixtures thereof. Examples of the insulating substrate also include a glass cloth impregnated with an epoxy resin, a bismaleimide triazine resin, a polyimide resin, or the like. Among these, a liquid crystal polymer is suitable for a purpose under a high frequency due to the remarkable advantages thereof including a low dielectric constant, a low dielectric tangent, a low water absorbing property, and a small change in electric characteristics, and further including a small dimensional change.

The surface-treated copper foil in the aspect of the invention is particularly useful as a copper foil for a flexible printed circuit board (FPC) containing a liquid crystal polymer and a copper foil laminated thereon. Among the insulating substrates, a liquid crystal polymer has a low mechanical strength and has a remarkable disadvantage that a sufficient peel strength is difficult to achieve with a material having a copper foil laminated thereon. When the roughness of the surface of the copper foil is increased, there is a tendency that the peel strength is increased due to the physical anchoring effect obtained, but the electric characteristics at a high frequency may be deteriorated due to the surface effect including the conductor loss described above. However, according to the embodiment of the aspect of the invention, the adhesiveness to an insulating substrate can be ensured even with a small surface roughness, and thus the aforementioned advantages of the liquid crystal polymer can be utilized.

A printed wiring board can be produced by using the copper-clad laminate board. The method for producing a printed wiring board from the copper-clad laminate board is not particularly limited, and it suffices to use a known etching process. A printed circuit board can be produced by mounting various electronic components on the printed wiring board. The printed circuit board can be mounted on various electronic apparatuses.

EXAMPLES

The invention will be described with reference to examples shown below. The examples show only preferred examples and do not limit the invention in any way. Accordingly, all modifications, examples, and embodiments within the technical concept of the invention are included in the invention. Comparative examples will also be shown below for the comparison to the invention. The balances of the liquids used in the roughening treatment, the plating, the silane coupling treatment, the heat resistance treatment, the rust prevention treatment, and the like described in the experimental examples described herein each are water unless otherwise indicated.

Examples 1 and 4 to 6 and Comparative Examples 1, 3, and 4

A rolled copper foil having a thickness of 12 μm (tough pitch copper (JIS H3100, alloy number: C1100), available from JX Nippon Mining & Metals Corporation) was prepared. The surface of the rolled copper foil was subjected to electrolytic degreasing, water cleaning, and pickling, and then subjected to a roughening treatment by performing a treatment for providing copper primary particles on the surface of the rolled copper foil, and then performing a treatment for providing secondary particles. The detailed conditions of the roughening treatment are as follows.

<Conditions of Roughening Treatment>
(Plating Condition of Copper Primary Particles)
 Composition of solution: copper: 10 g/L, sulfuric acid: 50 g/L
  Temperature of solution: 26° C.
  Current density: 50 A/dm$^2$
  Plating time: 1.5 sec
(Plating Condition of Copper Secondary Particles)
 Composition of solution: copper: 16 g/L, nickel: 9 g/L, cobalt: 8 g/L
  pH: 2.4
  Temperature of solution: 35° C.
  Current density: 25 A/dm$^2$
  Plating time: 1.5 sec After performing the aforementioned roughening treatments, a Ni—Co alloy plating treatment (heat resistance and rust prevention treatment) and a chromate treatment were performed in this order.

<Ni-Co Plating>: Ni—Co Alloy Plating
 Composition of solution: Co: 4 g/L, Ni: 12 g/L
 pH: 2.3
 Temperature of solution: 50° C.
 Current density: 12 A/dm$^2$
 Energizing time: 0.8 sec <Electrolytic Chromate>
 Composition of solution: potassium bichromate: 4 g/L, zinc (added as zinc sulfate): 0.5 g/L
 pH: 3.5
 Temperature of solution: 60° C.
 Current density: 2.0 A/dm$^2$
 Energizing time: 2 sec A micrograph of the chromate treatment surface was taken with a scanning electron microscope (SEM). The particles of the roughening treatment were observed on the micrograph. As a result, the average particle diameter of the copper primary particle layer was from 0.25 to 0.45 μm, and the average particle diameter of the secondary particle layer was from 0.05 to 0.25 μm. The diameter of the minimum circle surrounding the particle was measured and regarded as a particle diameter, and the average particle diameter was calculated. The size of the roughening particles is substantially not changed before and after the heat resistance and rust prevention treatment and the chromate treatment.

Subsequently, the surface having been subjected to the chromate treatment was subjected to a silane coupling treatment. The silane of the kind shown in Table 1 was mixed with water at 25° C. to make the silane concentration shown in Table 1, and the mixture was stirred at a stirring speed of 900 rpm for the period of time shown in Table 1, thereby preparing a silane coupling agent. The resulting silane coupling agent solution was coated on the surface-treated surface of the copper foil, and the excessive silane coupling agent solution was drained by attaching and rotating a stainless steel bar on the surface of the copper foil. Thereafter, the silane coupling treatment was performed by drying under a condition of 100° C. for 5 minutes.

Examples 2, 7, and 8 and Comparative Examples 5, 6, and 9

A rolled copper foil having a thickness of 12 μm and a composition containing oxygen free copper (OFC) having Ag added in an amount of from 50 to 100 ppm by mass (available from JX Nippon Mining & Metals Corporation) was prepared. The surface of the rolled copper foil was subjected to the roughening treatment, the heat resistance and rust prevention treatment, and the chromate treatment in this order in the same manner as in Example 1. The surface having been subjected to the chromate treatment was subjected to a silane coupling treatment. The silane of the kind shown in Table 1 was mixed with water at 25° C. to make the silane concentration shown in Table 1, and the mixture was stirred at a stirring speed of 900 rpm for the period of time shown in Table 1, thereby preparing a silane coupling agent. The resulting silane coupling agent solution was coated on the surface-treated surface of the copper foil, and the excessive silane coupling agent solution was drained by attaching and rotating a stainless steel bar on the surface of the copper foil. Thereafter, the silane coupling treatment was performed by drying under a condition of 100° C. for 5 minutes.

Examples 3 and 9 to 11 and Comparative Examples 2, 7, and 8

An ingot containing oxygen free copper having Sn added in an amount of 1,200 ppm was manufactured, and the ingot was hot-rolled from 900° C. to provide a sheet having a thickness of 10 mm. The sheet was repeatedly subjected to cold rolling and annealing, and finally cold-rolled to a copper foil having a thickness of 9 μm, thereby providing a rolled copper foil.

The rolled copper foil was subjected to a Ni plating treatment under the following condition (no roughening treatment was performed).
 Ni ion: 40 g/L
 Temperature: 50° C.
 Current density: 7.0 A/dm$^2$
 Plating time: 2.0 sec
 pH: 4.0

Subsequently, the Ni-plated surface was subjected to a silane coupling treatment. The silane of the kind shown in Table 1 was mixed with water at 25° C. to make the silane concentration shown in Table 1, and the mixture was stirred at a stirring speed of 900 rpm for the period of time shown in Table 1, thereby preparing a silane coupling agent. The resulting silane coupling agent solution was coated on the surface-treated surface of the copper foil, and the excessive silane coupling agent solution was drained by attaching and rotating a stainless steel bar on the surface of the copper foil. Thereafter, the silane coupling treatment was performed by drying under a condition of 100° C. for 5 minutes.

<XPS Analysis in Depth Profile>

The surface-treated surface of the resulting surface-treated copper foil was subjected to XPS analysis in the depth profile while sputtering under the aforementioned condition at a rate of 1.1 nm/min (SiO$_2$ conversion) with 5600MC, available from Ulvac-Phi, Inc. The elements to be measured were N1s, O1s, C1s, Si2s, Cr2p$^3$, Zn2p$^3$, Cu2p$^3$, Ni2p$^3$, and Co2p$^3$. The atomic concentrations of N, C, Si, and O after sputtering for 0.5 min and after sputtering for 1.0 min are shown in Table 1.

<Surface Roughness of Surface-Treated Copper Foil>

The ten-point average surface roughness Rz of the surface-treated surface of the resulting surface-treated copper foil was measured according to JIS B0601-1982 with a stylus roughness meter, Surfcorder SE-3C, available from Kosaka Laboratory Ltd. The results are shown in Table 1.

<Peel Strength>

The surface-treated surface of the resulting surface-treated copper foil was adhered to a liquid crystal polymer (Vecstar CT-Z, available from Kuraray Co., Ltd., a copolymer of hydroxybenzoic acid (ester) and hydroxy naphthoic acid (ester)) having a thickness of 50 μm by hot press to provide a copper-clad laminate board.

Heat condition: The assembly was heated at a temperature rising rate of approximately 5.1° C./min (reaching 305° C. after 60 minutes), retained at the temperature for 10 minutes, and then spontaneously cooled.

Pressure condition: The assembly was pressed at 4.0 MPa after 50 minutes from the start of heating, retained at the pressure for 30 minutes, and then released from the pressure.

The copper-clad laminate board thus obtained was measured for the 90° peel strength at ordinary temperature (25° C.). The peel strength was a value in the case where the copper foil was peeled from the liquid crystal polymer at an angle of 90° and a speed of 50 mm/min with a circuit width of 3 mm. The measurement of the peel strength is in accordance with JIS C6471-1995 (hereinafter the same). The measurement was performed twice, and the average value was designated as the measured value. The results are shown in Table 1.

<Solder Blister Test>

The surface-treated surface of the resulting surface-treated copper foils were adhered to both surfaces of a liquid crystal polymer (Vecstar CT-Z, available from Kuraray Co., Ltd.) having a thickness of 50 μm by hot press to provide a copper-clad laminate board.

Heat condition: The assembly was heated at a temperature rising rate of approximately 5.1° C./min (reaching 305° C. after 60 minutes), retained at the temperature for 10 minutes, and then spontaneously cooled.

Pressure condition: The assembly was pressed at 4.0 MPa after 50 minutes from the start of heating, retained at the pressure for 30 minutes, and then released from the pressure.

The copper-clad laminate board thus obtained was cut into a size of 40 mm×40 mm, and a grease was coated on the surface of the copper-clad laminate board for preventing attachment of solder. Thereafter, the copper-clad laminate board was floated on a solder bath at temperatures of from 300° C. to 330° C. for 10 seconds, and the state of blister formed on the surface of the copper-clad laminate board was visually evaluated under the following standard. The results are shown in Table 1.

AA: No blister was formed in the 40 mm×40 mm specimen.

A: Blister was formed in the 40 mm×40 mm specimen, but the area occupied by the blister was 10% or less.

B: The area occupied by the blister in the 40 mm×40 mm specimen was more than 10% and 20% or less.

C: The area occupied by the blister in the 40 mm×40 mm specimen was more than 20%.

<High-frequency Characteristics Test>

The surface-treated surface of the resulting surface-treated copper foils were adhered to both surfaces of a liquid crystal polymer (Vecstar CT-Z, available from Kuraray Co., Ltd.) having a thickness of 50 μm by hot press, and then a micro-strip line structure was formed for evaluating the high-frequency characteristics. The circuit was formed by etching to make a characteristic impedance of 50Ω. The transmission loss was measured with the circuit. In the case where the transmission loss (TL, unit: dB/cm) at a frequency of 30 GHz was $0 \geq TL \geq -0.8$, the specimen was evaluated as A. In the case where the transmission loss was $-0.8 > TL \geq -1.2$, the specimen was evaluated as B. In the case where the transmission loss was $-1.2 > TL \geq -10$, the specimen was evaluated as C. The results are shown in Table 1.

Examples 12 and 13 and Comparative Example 10

In Example 12, a surface-treated copper foil was produced in the same manner as in Example 1. In Example 13, a surface-treated copper foil was produced in the same manner as in Example 6. In Comparative Example 10, a surface-treated copper foil was produced in the same manner as in Comparative Example 1.

On the surface-treated surface of the resulting surface-treated copper foil, U-Varnish A, available from Ube Industries, Ltd., containing polyamic acid (approximately 20% by weight) and N-methyl-2-pyrrolidone (approximately 80% by weight) was coated with a doctor blade, Model YD-3, available from Yoshimitsu Seiki Co., Ltd. After coating, the varnish was dried in an oven at 100° C. for 20 minutes, and then cured for forming a polyimide resin by heating in a nitrogen substitution oven to 350° C. at a temperature rising rate of approximately 3° C./min over approximately 2 hours, and then retaining at 350° C. for 30 minutes, and thereby a copper foil-laminated board was obtained.

<Peel Strength>

The copper-clad laminate board thus obtained was measured for the 90° peel strength at ordinary temperature (25° C.). The peel strength was a value in the case where the copper foil was peeled from the polyimide resin at an angle of 90° and a speed of 50 mm/min with a circuit width of 3 mm. The measurement of the peel strength is in accordance with JIS C6471-1995 (hereinafter the same). The measurement was performed twice, and the average value was designated as the measured value. The results are shown in Table 1.

<Solder Blister Test>

The copper-clad laminate board thus obtained was cut into a size of 40 mm×40 mm, and a grease was coated on the surface of the copper-clad laminate board for preventing attachment of solder. Thereafter, the copper-clad laminate board was floated on a solder bath at temperatures of from 300° C. to 330° C. for 10 seconds, and the state of blister formed on the surface of the copper-clad laminate board was visually evaluated under the following standard. The results are shown in Table 1.

AA: No blister was formed in the 40 mm×40 mm specimen.

A: Blister was formed in the 40 mm×40 mm specimen, but the area occupied by the blister was 10% or less.

B: The area occupied by the blister in the 40 mm×40 mm specimen was more than 10% and 20% or less.

C: The area occupied by the blister in the 40 mm×40 mm specimen was more than 20%.

TABLE 1-1

| | | | | XPS (measured in depth profile) | | | | | | | |
|---|---|---|---|---|---|---|---|---|---|---|---|
| | | | | After sputtering for 0.5 min at rate of 1.1 nm/min (SiO$_2$ conversion) | | | | After sputtering for 1.0 min at rate of 1.1 nm/min (SiO$_2$ conversion) | | | |
| | Kind of Silane | Silane concentration (vol %) | Silane stirring time (hour) | N concentration (atomic %) | C concentration (atomic %) | O concentration (atomic %) | Si concentration (atomic %) | N concentration (atomic %) | C concentration (atomic %) | O concentration (atomic %) | Si concentration (atomic %) |
| Example 1 | 3-aminopropyl-triethoxysilane | 4 | 12 | 6.4 | 23.5 | 44.8 | 10.5 | 4.1 | 18.9 | 46.8 | 9.3 |
| Example 2 | 3-aminopropyl-triethoxysilane | 5 | 5 | 6.7 | 28.6 | 46.6 | 10.1 | 4.7 | 21.3 | 48.5 | 9.5 |
| Example 3 | 3-aminopropyl-triethoxysilane | 6 | 24 | 7.5 | 30 | 48 | 12.6 | 6.5 | 27 | 50.3 | 10.8 |
| Example 4 | 3-aminopropyl-triethoxysilane | 2.5 | 5 | 3.7 | 21.6 | 43.4 | 4.3 | 1.8 | 18.4 | 44.4 | 3.8 |
| Example 5 | 3-aminopropyl-triethoxysilane | 1.8 | 2 | 1.5 | 18.1 | 40 | 3.1 | 1 | 16.8 | 41.7 | 2.2 |
| Example 6 | 3-aminopropyl-trimethoxysilane | 4 | 12 | 4 | 23.8 | 46.4 | 11.9 | 3.8 | 19.7 | 47.4 | 11.1 |
| Example 7 | 3-aminopropyl-trimethoxysilane | 6 | 24 | 7.6 | 31.3 | 47 | 12.4 | 6.3 | 26.1 | 52 | 11.7 |
| Example 8 | 3-aminopropyl-trimethoxysilane | 3.5 | 5 | 5 | 22.7 | 44.6 | 5.8 | 4.2 | 20.7 | 45.7 | 5.1 |
| Example 9 | 3-aminopropyl-trimethoxysilane | 4.5 | 12 | 6.6 | 29.8 | 47.6 | 10.8 | 6.4 | 27.6 | 44.2 | 9.9 |
| Example 10 | N-2-(aminoethyl)-3-aminopropyl-trimethoxysilane | 1.8 | 24 | 1.6 | 11.1 | 29.3 | 2.7 | 1.9 | 8.7 | 28.7 | 2.2 |
| Example 11 | N-2-(aminoethyl)-3-aminopropyl-methldimethoxy-silane | 1.7 | 1 | 1.4 | 13.2 | 25.3 | 2.5 | 0.5 | 8 | 28.6 | 2 |
| Example 12 | 3-aminopropyl-triethoxysilane | 4 | 12 | 6.4 | 23.5 | 44.8 | 10.5 | 4.1 | 18.9 | 46.8 | 9.3 |
| Example 13 | 3-aminopropyl-trimethoxysilane | 4 | 12 | 4 | 23.8 | 46.4 | 11.9 | 3.8 | 19.7 | 47.4 | 11.1 |

TABLE 1-2

| | Surface roughness Rz of copper foil after silane strength coupling treatment (μm) | 90 deg peeling strength (kg/cm) | Solder blister test | | | | High frequency characteristics |
|---|---|---|---|---|---|---|---|
| | | | 300° C. | 310° C. | 320° C. | 330° C. | |
| Example 1 | 1.1 | 1.08 (A) | AA | AA | AA | AA | A |
| Example 2 | 0.95 | 0.95 (A) | AA | AA | A | A | A |
| Example 3 | 0.59 | 0 72 (A) | AA | A | B | B | A |
| Example 4 | 0.9 | 0.65 (A) | AA | AA | AA | A | A |
| Example 5 | 0.92 | 0.54 (A) | AA | AA | A | B | A |
| Example 6 | 1.05 | 1.10 (A) | AA | AA | AA | AA | A |
| Example 7 | 0.96 | 1.13 (A) | AA | B | B | B | A |
| Example 8 | 0.97 | 0.73 (A) | AA | AA | AA | AA | A |
| Example 9 | 0.59 | 0.61 (A) | AA | AA | A | A | A |
| Example 10 | 0.62 | 0.53 (A) | A | A | A | B | A |
| Example 11 | 0.6 | 0.50 (A) | A | A | A | B | A |
| Example 12 | 1.1 | 0.85 (A) polyimide | AA | AA | AA | AA | — |
| Example 13 | 1.05 | 0.75 (A) polyimide | AA | AA | AA | AA | — |

TABLE 1-3

| | | | | XPS (measured in depth profile) | | | | | | | |
|---|---|---|---|---|---|---|---|---|---|---|---|
| | | | | After sputtering for 0.5 min at rate of 1.1 nm/min (SiO$_2$ conversion) | | | | After sputtering for 1.0 min at rate of 1.1 nm/min (SiO$_2$ conversion) | | | |
| | Kind of Silane | Silane concentration (vol %) | Silane stirring time (hour) | N concentration (atomic %) | C concentration (atomic %) | O concentration (atomic %) | Si concentration (atomic %) | N concentration (atomic %) | C concentration (atomic %) | O concentration (atomic %) | Si concentration (atomic %) |
| Comparative Example 1 | N-2-(aminoethyl)-3-aminopropyl-trimethoxysilane | 6 | 12 | 11.1 | 36.7 | 37.2 | 10.2 | 9.9 | 32.4 | 41.5 | 9.4 |
| Comparative Example 2 | N-2-(aminoethyl)-3-aminopropyl-trimethoxysilane | 5 | 0.1 | 10.8 | 33.8 | 36.9 | 9.6 | 7.8 | 28.5 | 43.7 | 8.9 |
| Comparative Example 3 | N-2-(aminoethyl)-3-aminopropyl-trimethoxysilane | 3.5 | 0.1 | 7.7 | 31.1 | 35.1 | 5.2 | 6.2 | 29.3 | 36.1 | 4.7 |
| Comparative Example 4 | N-2-(aminoethyl)-3-aminopropylmethyl-dimethoxysilane | 4 | 12 | 10.3 | 36.6 | 32.5 | 10 | 8 | 27.6 | 36.9 | 9.9 |
| Comparative Example 5 | N-2-(aminoethyl)-3-aminopropylmethyl-dimethoxysilane | 3 | 0.1 | 7.9 | 32.3 | 30.6 | 7.2 | 6.4 | 26.1 | 33.1 | 6.6 |
| Comparative Example 6 | N-2-(aminoethyl)-3-aminopropylmethyl-dimethoxysilane | 8 | 15 | 8.7 | 36.8 | 49.4 | 12.1 | 6.9 | 31.3 | 50.2 | 11.1 |
| Comparative Example 7 | 3-aminopropyl-triethoxysilane | 7 | 0.1 | 8.5 | 35.4 | 48.3 | 11.6 | 6.1 | 29.8 | 50.4 | 10.9 |
| Comparative Example 8 | 3-aminopropyl-triethoxysilane | 0.5 | 0.1 | 0.8 | 8.9 | 19.7 | 1.1 | 0.67 | 4.1 | 18.4 | 0.7 |
| Comparative Example 9 | 3-aminopropyl-triethoxysilane | 1 | 0.1 | 1.1 | 10.9 | 23.4 | 1.8 | 0.78 | 6.3 | 21.7 | 1 |
| Comparative Example 10 | N-2-(aminoethyl)-3-aminopropyltri-methoxysilane | 6 | 12 | 11.1 | 36.7 | 37.2 | 10.2 | 9.9 | 32.4 | 41.5 | 9.4 |

TABLE 1-4

| | Surface roughness Rz of copper foil after silane coupling treatment (μm) | 90 deg peeling strength (kg/cm) | Solder blister test | | | | High frequency characteristics |
|---|---|---|---|---|---|---|---|
| | | | 300° C. | 310° C. | 320° C. | 330° C. | |
| Comparative Example 1 | 1.12 | 1.23 (A) | C | C | C | C | A |
| Comparative Example 2 | 0.61 | 0.77 (A) | C | C | C | C | A |
| Comparative Example 3 | 1.15 | 0.71 (A) | C | C | C | C | A |
| Comparative Example 4 | 1.07 | 0.73 (A) | C | C | C | C | A |
| Comparative Example 5 | 0.98 | 0.68 (A) | C | C | C | C | A |
| Comparative Example 6 | 0.91 | 1.33 (A) | C | C | C | C | A |
| Comparative Example 7 | 0.65 | 0.81 (A) | C | C | C | C | A |
| Comparative Example 8 | 0.61 | 0.15 (C) | A | A | C | C | A |
| Comparative Example 9 | 0.91 | 0.35 (C) | A | A | C | C | A |
| Comparative Example 10 | 1.12 | 1.23 (A) polyimide | C | C | C | C | — |

DISCUSSION

It is understood that the surface-treated copper foil that satisfies at least one concentration condition selected from the N atomic concentration, the C atomic concentration, and the combination of the Si and O atomic concentrations at a 0.5 min sputter depth from the surface-treated surface defined in the invention has high adhesiveness to a liquid crystal polymer at ordinary temperature, and is suppressed in the formation of blister on application of a thermal load to a copper-clad laminate board constituted by the copper foil. In Examples 1, 2, 4 to 6, 8, 10, and 11, in which the N and C atomic concentrations at a 1.0 min sputter depth were in the preferred ranges, in addition to those at a 0.5 min sputter depth, the effect of suppressing blister was excellent on application of a thermal load at 320° C. In Examples 1, 6, and 8, in which the N concentration, the C concentration, and the Si and O concentrations at a 0.5 min sputter depth were in the more preferred ranges, the effect of suppressing blister was excellent on application of a thermal load at 330° C. The same tendency is observed in the cases where a polyamide, a prepreg, and a fluorine resin were used as an insulating substrate, and thus it can be said that the effect of the invention is obtained not only in the case where the copper foil is adhered to a liquid crystal polymer, but also in the case where the copper foil is adhered to other insulating substrates.

In all Comparative Examples, the requirement relating to the N atomic concentration, the C atomic concentration, and the combination of the Si and O atomic concentrations at a 0.5 min sputter depth from the surface-treated surface defined in the invention was not satisfied since a thick silane coupling film was formed as the outermost layer of the surface-treated surface due to the high concentration of the silane coupling agent in Comparative Examples 1, 2, 4, 6, and 7, the hydrolysis reaction of the silane coupling agent was insufficient due to the insufficient stirring time in Comparative Examples 2, 3, 5, and 7, and a silane coupling film having a sufficient thickness was not formed as the outermost layer of the surface-treated surface due to the low concentration of the silane coupling agent in Comparative Examples 8 and 9. Accordingly, the formation of blister was not suppressed on application of a thermal load to a copper-clad laminate board constituted by the copper foil even though the high adhesiveness to a liquid crystal polymer at ordinary temperature was obtained. In Comparative Examples 8 and 9, the adhesiveness to a liquid crystal polymer at ordinary temperature was insufficient even though the formation of blister was suppressed.

The invention claimed is:

1. A surface-treated copper foil comprising a surface-treated surface, the surface-treated copper foil comprising an N concentration of from 1.5 atomic % to 7.5 atomic % by an XPS measurement at a depth after sputtering from the surface-treated surface for 0.5 min at a rate of 1.1 nm/min in terms of $SiO_2$ conversion.

2. The surface-treated copper foil according to claim 1, wherein the surface-treated copper foil comprises a C concentration of from 12 atomic % to 30 atomic % by an XPS measurement at a depth after sputtering from the surface-treated surface for 0.5 min at a rate of 1.1 nm/min in terms of $SiO_2$ conversion.

3. A surface-treated copper foil comprising a surface-treated surface, the surface-treated copper foil comprising a C concentration of from 12 atomic % to 30 atomic % by an XPS measurement at a depth after sputtering from the surface-treated surface for 0.5 min at a rate of 1.1 nm/min in terms of $SiO_2$ conversion.

4. The surface-treated copper foil according to claim 1, wherein the surface-treated copper foil comprises an Si concentration of 3.1 atomic % or more and an O concentration of from 40 atomic % to 48 atomic % by an XPS measurement at a depth after sputtering from the surface-treated surface for 0.5 min at a rate of 1.1 nm/min in terms of $SiO_2$ conversion.

5. The surface-treated copper foil according to claim 2, wherein the surface-treated copper foil comprises an Si concentration of 3.1 atomic % or more and an O concentration of from 40 atomic % to 48 atomic % by an XPS measurement at a depth after sputtering from the surface-treated surface for 0.5 min at a rate of 1.1 nm/min in terms of $SiO_2$ conversion.

6. The surface-treated copper foil according to claim 3, wherein the surface-treated copper foil comprises an Si concentration of 3.1 atomic % or more and an O concentration of from 40 atomic % to 48 atomic % by an XPS measurement at a depth after sputtering from the surface-treated surface for 0.5 min at a rate of 1.1 nm/min in terms of $SiO_2$ conversion.

7. A surface-treated copper foil comprising a surface-treated surface, the surface-treated copper foil comprising an Si concentration of 3.1 atomic % or more and an O concentration of from 40 atomic % to 48 atomic % by an XPS measurement at a depth after sputtering from the surface-treated surface for 0.5 min at a rate of 1.1 nm/min in terms of $SiO_2$ conversion.

8. The surface-treated copper foil according to claim 1, wherein the surface-treated copper foil comprises an N concentration of from 0.5 atomic % to 6.0 atomic % by an XPS measurement at a depth after sputtering from the surface-treated surface for 1.0 min at a rate of 1.1 nm/min in terms of $SiO_2$ conversion.

9. The surface-treated copper foil according to claim 3, wherein the surface-treated copper foil comprises an N concentration of from 0.5 atomic % to 6.0 atomic % by an XPS measurement at a depth after sputtering from the surface-treated surface for 1.0 min at a rate of 1.1 nm/min in terms of $SiO_2$ conversion.

10. The surface-treated copper foil according to claim 5, wherein the surface-treated copper foil comprises an N concentration of from 0.5 atomic % to 6.0 atomic % by an XPS measurement at a depth after sputtering from the surface-treated surface for 1.0 min at a rate of 1.1 nm/min in terms of $SiO_2$ conversion.

11. The surface-treated copper foil according to claim 7, wherein the surface-treated copper foil comprises an N concentration of from 0.5 atomic % to 6.0 atomic % by an XPS measurement at a depth after sputtering from the surface-treated surface for 1.0 min at a rate of 1.1 nm/min in terms of $SiO_2$ conversion.

12. The surface-treated copper foil according to claim 1, wherein the surface-treated copper foil comprises a C concentration of from 8 atomic % to 25 atomic % by an XPS measurement at a depth after sputtering from the surface-treated surface for 1.0 min at a rate of 1.1 nm/min in terms of $SiO_2$ conversion.

13. The surface-treated copper foil according to claim 3, wherein the surface-treated copper foil comprises a C concentration of from 8 atomic % to 25 atomic % by an XPS measurement at a depth after sputtering from the surface-treated surface for 1.0 min at a rate of 1.1 nm/min in terms of $SiO_2$ conversion.

14. The surface-treated copper foil according to claim 5, wherein the surface-treated copper foil comprises a C concentration of from 8 atomic % to 25 atomic % by an XPS measurement at a depth after sputtering from the surface-treated surface for 1.0 min at a rate of 1.1 nm/min in terms of $SiO_2$ conversion.

15. The surface-treated copper foil according to claim 7, wherein the surface-treated copper foil comprises a C concentration of from 8 atomic % to 25 atomic % by an XPS measurement at a depth after sputtering from the surface-treated surface for 1.0 min at a rate of 1.1 nm/min in terms of $SiO_2$ conversion.

16. The surface-treated copper foil according to claim 10, wherein the surface-treated copper foil comprises a C concentration of from 8 atomic % to 25 atomic % by an XPS measurement at a depth after sputtering from the surface-treated surface for 1.0 min at a rate of 1.1 nm/min in terms of $SiO_2$ conversion.

17. The surface-treated copper foil according to claim 16, wherein the surface-treated copper foil satisfies one or two of the following conditions (A) and (B):
   (A) the surface-treated copper foil comprising an N concentration of from 3.7 atomic % to 6.4 atomic % by an XPS measurement at a depth after sputtering from the surface-treated surface for 0.5 min at a rate of 1.1 nm/min in terms of $SiO_2$ conversion;
   (B) the surface-treated copper foil comprising a C concentration of from 21.6 atomic % to 23.8 atomic % by an XPS measurement at a depth after sputtering from the surface-treated surface for 0.5 min at a rate of 1.1 nm/min in terms of $SiO_2$ conversion.

18. The surface-treated copper foil according to claim 1, wherein the surface-treated surface comprises a ten-point average surface roughness Rz of 1.5 μm or less.

19. The surface-treated copper foil according to claim 1, wherein the surface-treated copper foil is a rolled copper foil or an electrolytic copper foil.

20. The surface-treated copper foil according to claim 1, wherein the surface-treated copper foil is for attaching to a liquid crystal polymer.

21. The surface-treated copper foil according to claim 1, wherein the surface-treated copper foil is for attaching to a polyimide resin.

22. The surface-treated copper foil according to claim 1, wherein the surface-treated copper foil is used in a printed circuit board that is used under a high frequency exceeding 1 GHz.

23. The surface-treated copper foil according to claim 1, wherein the surface-treated copper foil contains, on a surface of the copper foil, one or more layers selected from the group consisting of a roughening treatment layer, a heat resistance treatment layer, a rust prevention treatment layer, a chromate treatment layer, and a silane coupling treatment layer.

24. The surface-treated copper foil according to claim 1, wherein the surface-treated copper foil contains, on a surface of the copper foil, one or more layers selected from the group consisting of a heat resistance treatment layer, a rust prevention treatment layer, a chromate treatment layer, and a silane coupling treatment layer.

25. The surface-treated copper foil according to claim 1, wherein the surface-treated copper foil contains a heat resistance treatment layer or a rust prevention treatment layer on a surface of the copper foil, contains a chromate treatment layer on the heat resistance treatment layer or the rust prevention treatment layer, and contains a silane coupling treatment layer on the chromate treatment layer.

26. The surface-treated copper foil according to claim 1, wherein the surface-treated copper foil contains a heat resistance treatment layer on a surface of the copper foil, contains a rust prevention treatment layer on the heat resistance treatment layer, contains a chromate treatment layer on the rust prevention treatment layer, and contains a silane coupling treatment layer on the chromate treatment layer.

27. The surface-treated copper foil according to claim 1, wherein the surface-treated copper foil contains a chromate treatment layer on a surface of the copper foil, and contains a silane coupling treatment layer on the chromate treatment layer.

28. The surface-treated copper foil according to claim 1, wherein the surface-treated copper foil contains a roughening treatment layer on a surface of the copper foil, contains a chromate treatment layer on the roughening treatment layer, and contains a silane coupling treatment layer on the chromate treatment layer.

29. The surface-treated copper foil according to claim 1, wherein the surface-treated copper foil contains a roughening treatment layer on a surface of the copper foil, contains one or more layers selected from the group consisting of a rust prevention treatment layer and a heat resistance treatment layer on the roughening treatment layer, contains a chromate treatment layer on the one or more layers selected from the group consisting of a rust prevention treatment layer and a heat resistance treatment layer, and contains a silane coupling treatment layer on the chromate treatment layer.

30. The surface-treated copper foil according to claim 1, wherein the surface-treated copper foil contains a roughening treatment layer on a surface of the copper foil, contains a rust prevention treatment layer on the roughening treatment layer, contains a chromate treatment layer on the rust prevention treatment layer, and contains a silane coupling treatment layer on the chromate treatment layer.

31. The surface-treated copper foil according to claim 1, wherein the surface-treated copper foil contains a roughening treatment layer on a surface of the copper foil, and contains a silane coupling treatment layer on the roughening treatment layer.

32. The surface-treated copper foil according to claim 1, wherein the surface-treated copper foil contains a silane coupling treatment layer on a surface of the copper foil.

33. The surface-treated copper foil according to claim 1, wherein the surface-treated copper foil contains a roughening treatment layer on a surface of the copper foil, and the roughening treatment layer contains a primary particle layer and a secondary particle layer on the primary particle layer.

34. The surface-treated copper foil according to claim 33, wherein the secondary particle layer contains a ternary alloy system containing copper, cobalt, and nickel.

35. The surface-treated copper foil according to claim 33, wherein the primary particle layer comprises an average particle diameter of from 0.25 μm to 0.45 μm, and the secondary particle layer comprises an average particle diameter of from 0.05 μm to 0.25 μm.

36. A copper foil-laminated board comprising the surface-treated copper foil according to claim 1 and an insulating substrate that is adhered to the surface-treated surface of the surface-treated copper foil.

37. A printed wiring board comprising the surface-treated copper foil according to claim 1.

38. An electronic apparatus comprising the printed wiring board according to claim 37.

* * * * *